United States Patent
Terada et al.

(10) Patent No.: US 8,344,320 B2
(45) Date of Patent: Jan. 1, 2013

(54) ELECTRON MICROSCOPE WITH ELECTRON SPECTROMETER

(75) Inventors: Shohei Terada, Hitachinaka (JP); Yoshihumi Taniguchi, Hitachinaka (JP); Kazutoshi Kaji, Hitachi (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 12/985,708

(22) Filed: Jan. 6, 2011

(65) Prior Publication Data

US 2011/0095182 A1  Apr. 28, 2011

Related U.S. Application Data

(62) Division of application No. 12/183,726, filed on Jul. 31, 2008, now Pat. No. 7,888,641.

(30) Foreign Application Priority Data

Jul. 31, 2007  (JP) ................................ 2007-198282

(51) Int. Cl.
- H01J 37/147 (2006.01)
- H01J 37/28 (2006.01)
- G01N 23/02 (2006.01)
- G21K 5/04 (2006.01)

(52) U.S. Cl. ........ 250/305; 250/310; 250/311; 250/306; 250/307; 356/301

(58) Field of Classification Search .................. 250/305, 250/310, 311; 356/301
See application file for complete search history.

(56) References Cited

U.S. PATENT DOCUMENTS

| | | | | |
|---|---|---|---|---|
| 4,766,372 | A * | 8/1988 | Rao | 324/754.22 |
| 5,670,782 | A * | 9/1997 | Sato | 250/310 |
| 5,929,457 | A * | 7/1999 | Okino | 250/492.22 |
| 5,965,894 | A * | 10/1999 | Krijn et al. | 250/396 R |
| 6,514,767 | B1 * | 2/2003 | Natan | 436/166 |
| 6,548,811 | B1 * | 4/2003 | Nakamura et al. | 250/311 |
| 6,794,648 | B2 * | 9/2004 | Kaji et al. | 250/311 |
| 6,885,445 | B2 * | 4/2005 | Bennett et al. | 356/301 |
| 6,933,501 | B2 * | 8/2005 | Kaji et al. | 250/311 |
| 6,946,654 | B2 * | 9/2005 | Gerlach et al. | 850/3 |
| 6,946,656 | B2 * | 9/2005 | Ezumi et al. | 850/11 |
| 7,067,805 | B2 * | 6/2006 | Kajl et al. | 250/305 |
| 7,087,899 | B2 * | 8/2006 | Ezumi et al. | 250/311 |
| 7,250,601 | B2 * | 7/2007 | Kaji et al. | 250/305 |
| 7,285,776 | B2 * | 10/2007 | Nakamura et al. | 250/305 |

(Continued)

FOREIGN PATENT DOCUMENTS

JP  2000-285845  10/2000

(Continued)

OTHER PUBLICATIONS

Japanese Office Action with partial English translation issued in application No. 2007-198282 issued on Nov. 15, 2011.

(Continued)

*Primary Examiner* — David A Vanore
(74) *Attorney, Agent, or Firm* — McDermott Will & Emery LLP

(57) ABSTRACT

A lens adjustment method and a lens adjustment system which adjust a plurality of multi-pole lenses of an electron spectrometer attached to a transmission electron microscope, optimum conditions of the multi-pole lenses are determined through simulation based on a parameter design method using exciting currents of the multi-pole lenses as parameters.

18 Claims, 8 Drawing Sheets

U.S. PATENT DOCUMENTS

| | | | |
|---|---|---|---|
| 7,372,028 B2* | 5/2008 | Ezumi et al. | 250/310 |
| 7,378,668 B2* | 5/2008 | Tanimoto et al. | 250/396 R |
| 7,385,197 B2* | 6/2008 | Nakasuji et al. | 250/310 |
| 7,405,824 B2* | 7/2008 | Hikichi et al. | 356/317 |
| 7,655,907 B2* | 2/2010 | Tanimoto et al. | 250/310 |
| 7,671,687 B2* | 3/2010 | LeChevalier | 330/308 |
| 7,683,894 B2* | 3/2010 | Kent | 345/177 |
| 7,700,918 B2* | 4/2010 | Ezumi et al. | 250/310 |
| 7,888,641 B2* | 2/2011 | Terada et al. | 250/310 |
| 2002/0096632 A1* | 7/2002 | Kaji et al. | 250/305 |
| 2004/0060659 A1 | 4/2004 | Morioka et al. | |
| 2004/0183011 A1* | 9/2004 | Kaji et al. | 250/305 |
| 2004/0211899 A1* | 10/2004 | Ezumi et al. | 250/310 |
| 2006/0011836 A1* | 1/2006 | Kaji et al. | 250/310 |
| 2006/0163479 A1* | 7/2006 | Kaji et al. | 250/310 |
| 2009/0045340 A1* | 2/2009 | Terada et al. | 250/311 |
| 2009/0194691 A1* | 8/2009 | Kaji | 250/311 |
| 2010/0102227 A1* | 4/2010 | Chen et al. | 250/311 |
| 2010/0108882 A1* | 5/2010 | Zewail | 250/307 |
| 2010/0127168 A1* | 5/2010 | Khursheed | 250/305 |
| 2011/0095182 A1* | 4/2011 | Terada et al. | 250/305 |

FOREIGN PATENT DOCUMENTS

| | | |
|---|---|---|
| JP | 2003-151478 | 5/2003 |
| JP | 2003-151478 A | 5/2003 |
| JP | 2006-173524 A | 6/2006 |

OTHER PUBLICATIONS

U.S. Appl. No. 12/024,357, filed Feb. 1, 2008.

European Search Report issued in European Patent Application No. 08013707.8-2208, mailed Dec. 16, 2009.

Entire Prosecution of U.S. Appl. No. 12/183,726 to Terada, et al., filed Jul. 31, 2008, entitled "Electron Microscope With Electron Spectrometer".

* cited by examiner

FIG. 4

|  | PARAMETER 1 | PARAMETER 2 | PARAMETER 3 |
|---|---|---|---|
| LENS 1 | ░ |  | ▓ |
| LENS 2 | ░ |  | ▓ |
| LENS 3 | ░ |  | ▓ |
| LENS 4 | ░ |  | ▓ |

FIG. 5

|  | LENS 1 | LENS 2 | LENS 3 | LENS 4 |
|---|---|---|---|---|
| EXPERIMENT CONDITION 1 | ░ | ░ | ░ | ░ |
| EXPERIMENT CONDITION 2 | ░ |  |  |  |
| EXPERIMENT CONDITION 3 | ░ | ▓ | ▓ | ▓ |
| EXPERIMENT CONDITION 4 |  | ░ |  | ░ |
| EXPERIMENT CONDITION 5 |  |  | ▓ | ░ |
| EXPERIMENT CONDITION 6 |  | ▓ | ░ |  |
| EXPERIMENT CONDITION 7 | ▓ | ░ | ▓ |  |
| EXPERIMENT CONDITION 8 | ▓ |  | ░ | ▓ |
| EXPERIMENT CONDITION 9 | ▓ |  |  | ░ |

ELECTRON MICROSCOPE WITH ELECTRON SPECTROMETER

This application is a Divisional of U.S. Ser. No. 12/183,726, filed on Jul. 31, 2008, now U.S. Pat. No. 7,888,641, and claims priority of Japanese Application No. 2007-198282, filed on Jul. 31, 2007, the disclosures of which Applications are incorporated by reference herein.

BACKGROUND OF THE INVENTION

The present invention relates to an electron microscope with an electron spectrometer capable of acquiring an electron energy loss spectrum and a two-dimensional element distribution image and more particularly, to an electron microscope with a lens adjustment system capable of adjusting the electron spectrometer highly efficiently and highly accurately and to a lens adjustment method as well.

With advancement of fineness of working dimensions of a silicon semiconductor, a magnetic device and the like and with advancement of their high-grade integration, problems of degradation in device characteristics and reduction in reliability have now become more serious than heretofore in the course of developing a new process and of a mass production process. In recent years, for the purpose of getting to the root of causes of the faults as above, a spectroscopic analysis/two-dimensional distribution analysis based on electron energy loss spectroscopy (EELS) using a transmission or (scanning) transmission electron microscope ((S) TEM) has become an indispensable analytical means in analysis of faults of nanometer area in the semiconductor device and has been fulfilling itself in an analysis of faults in which the chemical reactions take part in the process development and mass production.

For the electron energy loss spectroscopy, electron energy loss observation equipment using an electron microscope and an electron spectrometer for energy dispersion in combination is employed. The electron spectrometer has the ability to acquire electron energy loss spectra and a two-dimensional element distribution by making use of an energy dispersion of an incident electron beam and a group of lenses such as multi-pole lenses to perform the enlargement/constriction of spectrum and the adjustment of focus.

Upon installing the electron spectrometer, a plurality of lenses inside the electron spectrometer are optimized for placing the energy resolution in good condition. But because of the lenses varying with time and the change of external disturbance near the apparatus, the electron spectrometer is not always used in the optimal condition.

As a solution to the aforementioned problem, JP-A-2003-151478 discloses a trial expedient according to which the magnetic field intensity of a multi-pole lens is changed every observation of an electron energy loss spectrum in such a way that the optimal condition of the electron spectrometer satisfies either a condition of minimization of the half-width of a peak due to a zero-loss spectrum or a condition of maximization of the intensity of a peak of a zero-loss spectrum, or both, and then optimization of the energy resolution is managed to be attained with the help of changed magnetic field intensity.

JP-A-2000-285845 also discloses a trial expedient in which with a view to efficiently adjusting the mechanical position of a spectroscope and the projection lens as well, a wobbler circuit that generates a wobbler signal of predetermined amplitude and frequency is provided and the spectroscope mechanical position and the projection lens are adjusted on the basis of an image shift or a defocus taking place when the spectroscope exciting current is increased/decreased with the help of the wobbler signal.

SUMMARY OF THE INVENTION

In JP-A-2003-151478, the condition of magnetic field intensity for optimizing the value of either the half-width of a peak due to the zero-loss spectrum or the intensity of the zero-loss electron or both is selected and is used as the optimum condition for the energy resolution. Accordingly, in order to determine the condition of the minimized half-width of the zero-loss spectrum peak, a condition for minimizing the peak half-width must be determined while adjusting the magnetic field intensity of each of the plural lenses inside the electron spectrometer over a range of all variation areas and much time is consumed. Further, in selecting the condition of the maximum intensity of the zero-loss electron, each of the plural lenses inside the electron spectrometer must be adjusted over a range of all of magnetic field intensity varying areas.

In addition, in case the electron beam intensity cannot always be constant owing to instability of an electron source or variations in external disturbance, it is difficult to place the energy resolution of spectrum in optimal condition by determining the maximum value of electron beam intensity.

In the expedient having the wobbler circuit for generating a wobbler signal described in JP-A-2000-285845, the condition for optimizing the energy resolution of a spectrum needs to be determined by adjusting the exciting current of each lens over the whole of its variation areas, consuming much time.

As described above, each of the techniques disclosed in JP-A-2003-151478 and JP-A-2000-285845 is directed to an adjustment method for optimization of the energy resolution in the electron spectrometer attached to the electron microscope but has difficulties in making adjustments of the individual lenses at a time. Accordingly, the trade-off between far higher efficiency and far higher accuracy must be studied. Furthermore, improvements in easy-to-operate capability are desired.

Under the circumstances, the present invention intends to solve the problems the conventional method of adjusting an electron spectrometer attached to a (scanning) transmission electron microscope faces and it is an object of this invention to provide method and system for adjustment of electron spectrometer lenses which can permit the optimal condition adjustment highly efficiently and highly accurately.

To accomplish the above object, according to the present invention, an electron microscope having an electron spectrometer adapted to acquire an electron energy loss spectrum or a two-dimensional element distribution image comprises an electron spectrometer controller for adjusting a plurality of lenses provided in the electron spectrometer, the controller being operative to set conditions of the individual lenses on the basis of a parameter design method using exciting conditions of the individual lenses as parameters. Thus, in acquiring an electron energy loss spectrum and a two-dimensional element image distribution by means of the electron spectrometer, optimum conditions of the plurality of lenses can be set highly efficiently and highly accurately.

The electron microscope, electron spectrometer and electron spectrometer controller are not always required to be configured integrally but the electron microscope and electron spectrometer may be combined suitably to provide an electron energy loss spectrum observation apparatus.

To solve the aforementioned problems, the present invention is also concerned with lens adjusting method and system, wherein an electron microscope is attached with an electron spectrometer having a plurality of lenses and wherein in adjusting the optimum conditions of the lenses, optimum conditions of exciting currents of the individual lenses are set through simulation based on a parameter design method using, as parameters, exciting current values of the plurality of lenses or values set on the basis of the exciting current values.

The lens adjustment as above comprises a step of inputting the parameters, a step of allotting the parameters to an orthogonal array, preparing a factor effect table by the results of experiments based on the orthogonal array, a step of simulating optimum conditions of exciting currents of the individual lenses and a step of setting exciting currents of the individual lenses through the simulation.

According to the present invention, an electron spectrometer for subjecting to spectral diffraction an electron beam having transmitted through a specimen comprises a lens adjustment system adapted to set an optimum condition of each of the plural lenses provided for the electron spectrometer through simulation based on a parameter design method using an exciting current as a parameter.

The electron spectrometer may be used as an apparatus integral with the electron microscope or may be used in suitable combination with a conventional electron microscope. It is sufficient for the lens adjustment system to operate to acquire data of spectra delivered out of the electron spectrometer and to control the lenses and the lens adjustment system may therefore be incorporated into the electron spectrometer controller or the electron microscope controller.

The lens adjustment method of setting optimum conditions of exciting currents for the individual lenses through simulation based on the parameter design method using the exciting currents as parameters as in the above techniques can also be applied to other apparatus having a plurality of lenses than the electron microscope and electron spectrometer.

According to the present invention, the electron microscope can be provided which can adjust highly efficiently and highly accurately the optimum conditions of the plurality of lenses the electron spectrometer has and can measure energy with high resolution. Further, according to the above lens adjustment method and system for the electron spectrometer, the lenses can be adjusted within a short period of time with easy-to-operation capability.

Other objects, features and advantages of the invention will become apparent from the following description of the embodiments of the invention taken in conjunction with the accompanying drawings.

BRIEF DESCRIPTION OF THE DRAWINGS

FIG. 4 is a diagram useful to explain an input table of exciting current parameters of the multi-pole lenses.

FIG. 5 is a diagram for explaining an L-9 orthogonal array in the present invention.

DETAILED DESCRIPTION OF THE EMBODIMENTS

An electron microscope of the present invention will now be described in greater detail.

An electron energy loss spectrum can principally be classified into a zero-loss spectrum that does not loose energy during passage of an electron beam through a specimen, a plasmon loss spectrum acquired by exciting a valance band electron and loosing energy and a core electron excitation loss spectrum acquired by exciting a core electron and loosing energy. In the core electron excitation loss (core loss) spectrum, a fine structure can be observed in the vicinity of the absorption edge. The structure is referred to as an energy loss near-edge structure (ELNES) and has information in which an electron state and a chemical-bonding state of a specimen are reflected. Furthermore, an energy loss value (absorption edge position) is specific to an element and therefore, can be analyzed qualitatively. In addition, information related to peripheral coordination of an element of interest can be acquired from a shift of an energy loss value which is referred to as a chemical shift and therefore, a simplified analysis of the state can also be made.

For the purpose of knowing details of an energy loss near-edge fine structure of the core loss spectrum, a spectrum needs to be acquired under a good energy resolution condition. The energy resolution can be evaluated by a half-width of a zero-loss spectrum. In other words, a small half-width of a peak of the zero-loss spectrum is expressed as corresponding to a condition of good energy resolution.

The core loss spectrum can be acquired with an apparatus using a transmission electron microscope or a scanning transmission electron microscope in combination with an electron spectrometer.

Figure 1A:
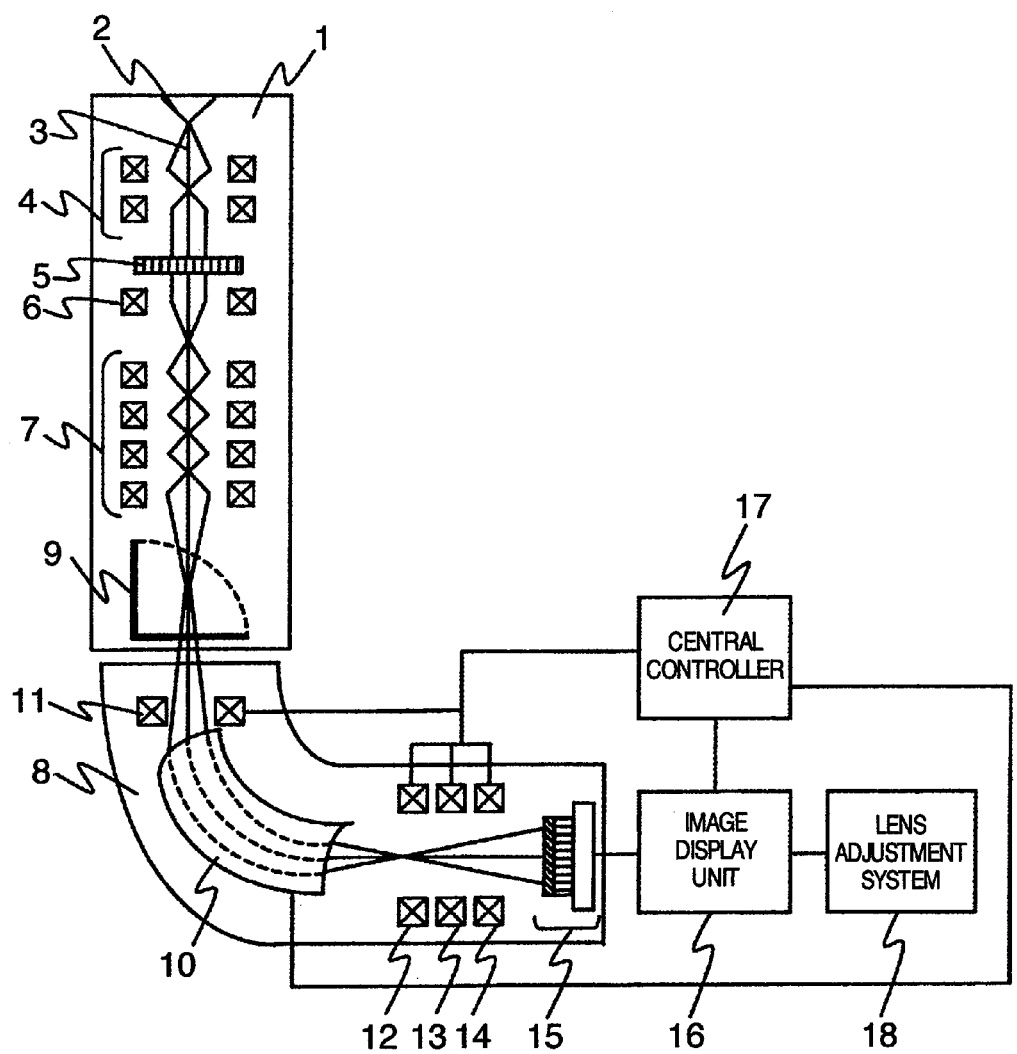
FIG. 1A is a diagram schematically showing an example of construction of a transmission electron microscope with an electron spectrometer according to the present invention.
Figure 1B:
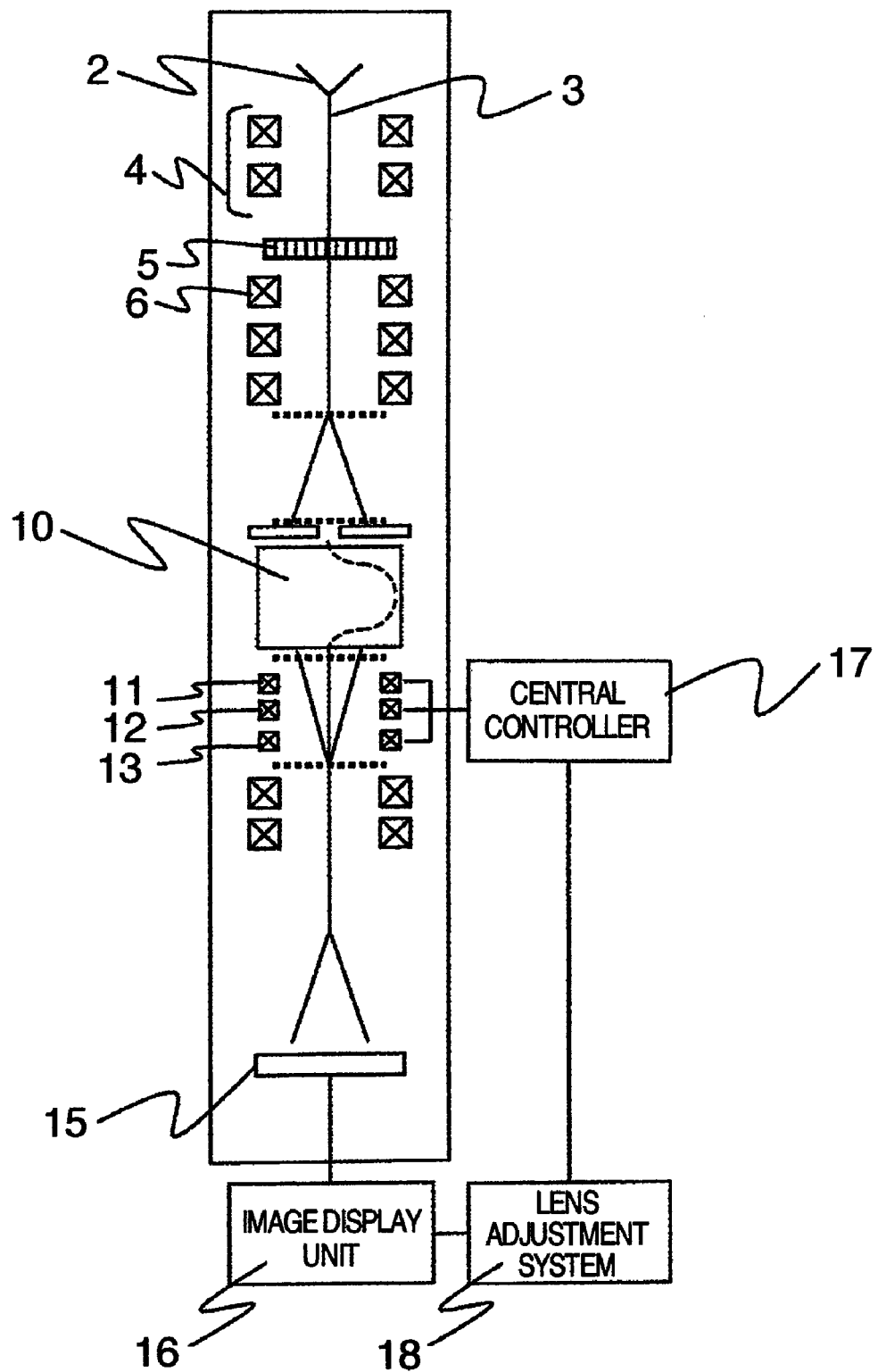
FIG. 1B is a diagram schematically showing another example of construction of a transmission electron microscope with an electron spectrometer according to the invention.

An embodiment of the present invention will now be described by way of example of a method of acquiring a core loss spectrum by means of a transmission electron microscope with electron spectrometer by making reference to the accompanying drawings. FIGS. 1A and 1B schematically illustrate the present embodiment.

The transmission electron microscope with electron spectrometer according to the present embodiment comprises a transmission electron microscope 1, an electron spectrometer 8, an image display unit 16, a central controller 17 and a lens adjustment system 18. Arranged in the transmission electron microscope 1 are an electron source 2 for emitting an electron beam 3, a convergent lens 4, an objective lens 6, an image forming lens system 7 and a fluorescent screen 9. A specimen 5 is interposed between convergent lens 4 and objective lens 6. The electron spectrometer 8 includes a magnetic field sector 10, multi-pole lenses 11, 12, 13 and 14 and an imaging unit 15.

The construction of transmission electron microscope 1 and that of electron spectrometer 8 are not limited to this. The multi-pole lenses 11, 12, 13 and 14 inside the electron spectrometer 8 are exemplified as including one disposed before the magnetic field sector 10 and three disposed after it but preceding and succeeding arrangements of two/two, three/one, four/zero or zero/four may be taken. Further, the number of multi-pole lenses is not limited to four and the present invention may be applied widely to an electron spectrometer having two, three or five or more plural multi-pole lenses.

The electron beam 3 emitted from the electron source 2 passes through the convergent lens 4 inside the transmission electron microscope and is irradiated on the specimen 5. The electron beam 3 having transmitted through the specimen 5 passes through the image objective lens 6 and the image forming lens system 7 comprised of a plurality of image forming lenses and directly enters the electron spectrometer 8 when the fluorescent screen 9 is opened.

In acquiring a core loss spectrum, the electron beam is caused to enter the electron spectrometer attached to the transmission electron microscope directly beneath it. The electron spectrometer has the magnetic field sector and multi-pole lenses for adjustment of focus of a spectrum and enlargement thereof and for reduction of a spectrum aberration as well before and after the magnetic field sector.

The entering electron beam 3 passes through the multi-pole lenses 11, 12, 13 and 14 which are used for focusing and enlarging an electron energy loss spectrum and reducing aberration thereof as well and also through the magnetic field sector 10 inside the electron spectrometer 8. Then, spectra resulting from energy dispersion by the magnetic field sector are picked up by means of the imaging unit 15 to provide electron energy loss spectra or a two-dimensional element distribution which in turn is displayed on the image display unit 16.

The imaging unit has photo-detector elements that are arrayed linearly or two-dimensionally and acquisition of the electron energy loss spectra or two-dimensional element distribution image can be achieved by means of the imaging unit. The magnetic field sector 10 and the multi-pole lenses 11, 12, 13 and 14 are controlled by means of the central controller 17. The contents of control can be confirmed by means of the image display unit. The contents of control is saved or stored in the controller as necessary.

Before acquiring a desired electron energy loss spectrum from the specimen 5, a factor effect table is prepared in the lens adjustment system through simulation based on a parameter design method using exciting currents of the plural multi-pole lenses 11, 12, 13 and 14 as parameters and conditions of the individual lenses for minimizing the peak half-width of a zero-loss spectrum are determined by using the factor effect table and then the multi-pole lenses 11, 12, 13 and 14 inside the electron spectrometer 8 are adjusted. Since the contents of control such as the lens conditions are stored as necessary, preceding control conditions can be used for adjustment of the lenses, contributing to high efficiency of simulation and optimization of the results.

In FIG. 1A, the lens adjustment system is attached to the image display unit but it may be mounted to the central controller for controlling the electron spectrometer or to an electron microscope controller not shown. Further, the electron microscope illustrated in FIG. 1A is a post-column type electron microscope connected with the electron spectrometer but an in-column type may be used having an electron spectrometer built in an electron microscope as shown in FIG. 1B.

Figure 2:
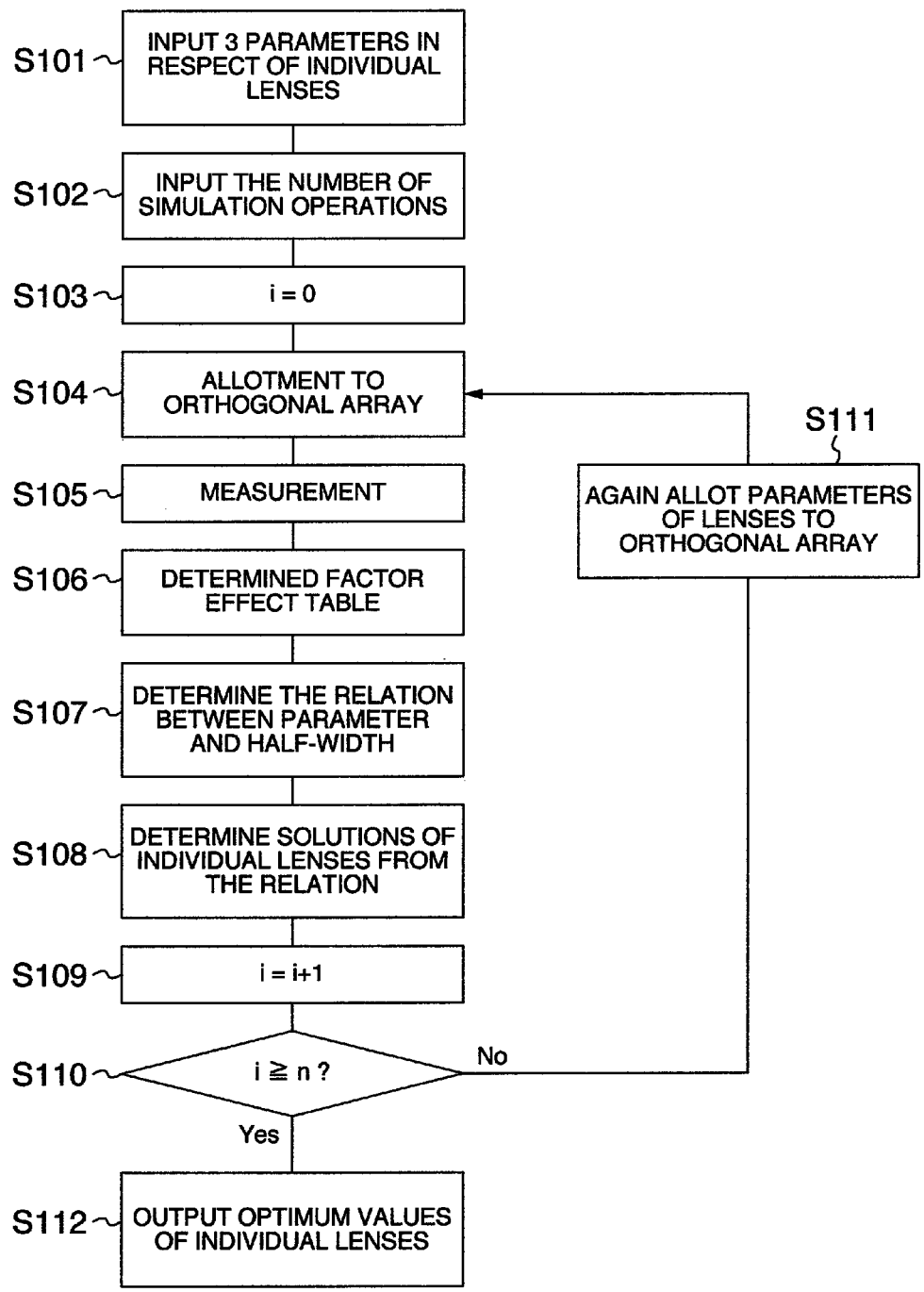
FIG. 2 is a flowchart showing procedures of adjustment of multi-pole lenses inside the electron spectrometer according to the invention.

Referring to FIG. 2, a flowchart shows an example of procedures of adjustment of multi-pole lenses in the lens adjustment system for minimizing the half-width of peak of a zero-loss spectrum. When at least S103 to S112 in FIG. 2 are executed by means of the lens adjustment system, the lenses can be adjusted highly efficiently by reducing load imposed on the operator.

Firstly, at least three exciting current values of each multi-pole lens are inputted as parameters (S 101). For the exciting current of each lens, the input values may be a maximum value, an intermediate value and a minimum value within a variation range or for an exciting current during apparatus installation, the input values may fall into a range of predetermined upper and lower values. In connection with a lens having less influence upon the adjustment of spectra, the parameter may be fixed at the time of apparatus installation or apparatus production. In such a case, a plurality of parameters are fixed during apparatus installation and unfixed parameters are adjusted during measurement. The fixed parameters may also be used for simulation of lens adjustment but by eliminating the fixed values from the parameters, the simulation can be simplified.

Next, the number of simulation operations (simulation frequency) is inputted (S102). The simulation frequency is one or more and is not limitative. But in case the simulation frequency is large, much time is required to determine optimum conditions of the individual lenses and so it is preferable that before conducting adjustment of the lenses, the half-width of the zero-loss spectrum at present be once confirmed. By the dint of the confirmation of the spectrum before adjustment, setting of the frequency of simulation can be changed in accordance with the result of confirmation and time to be consumed until the necessary adjustment ends can be shortened.

After the frequency of simulation has been set, parameters of each lens are allotted to an orthogonal array based on the Taguchi method (S103, 104). When there are five or more lenses necessary for adjustment, an L-18 orthogonal array is used and for the number of lenses being four or less, an L-9 orthogonal array may be used. Under the experiment conditions based on the orthogonal array, the zero-loss spectrum is measured, peak half-widths of the zero-loss spectrum under the individual conditions for acquisition of measurement results are calculated to prepare a factor effect table and thereafter, an expression indicative of the relation between the parameter of each lens and the half-width is acquired (S105 to S107).

From the relation, solutions to parameters of each lens are determined (S108). If the simulation frequency set before starting the simulation is not reached, the parameters of each lens are again set and the above procedure is again carried out (S109 to S111). In setting parameters at the second and ensuing frequency, the accuracy can be improved by limiting the range of upper and lower limit values of parameters more strictly at the present than at the previous simulation.

After completion of a predetermined number of simulation operations, solutions to the individual lenses are outputted (S112). The optimum values are set and the individual lenses are adjusted.

Figure 3:
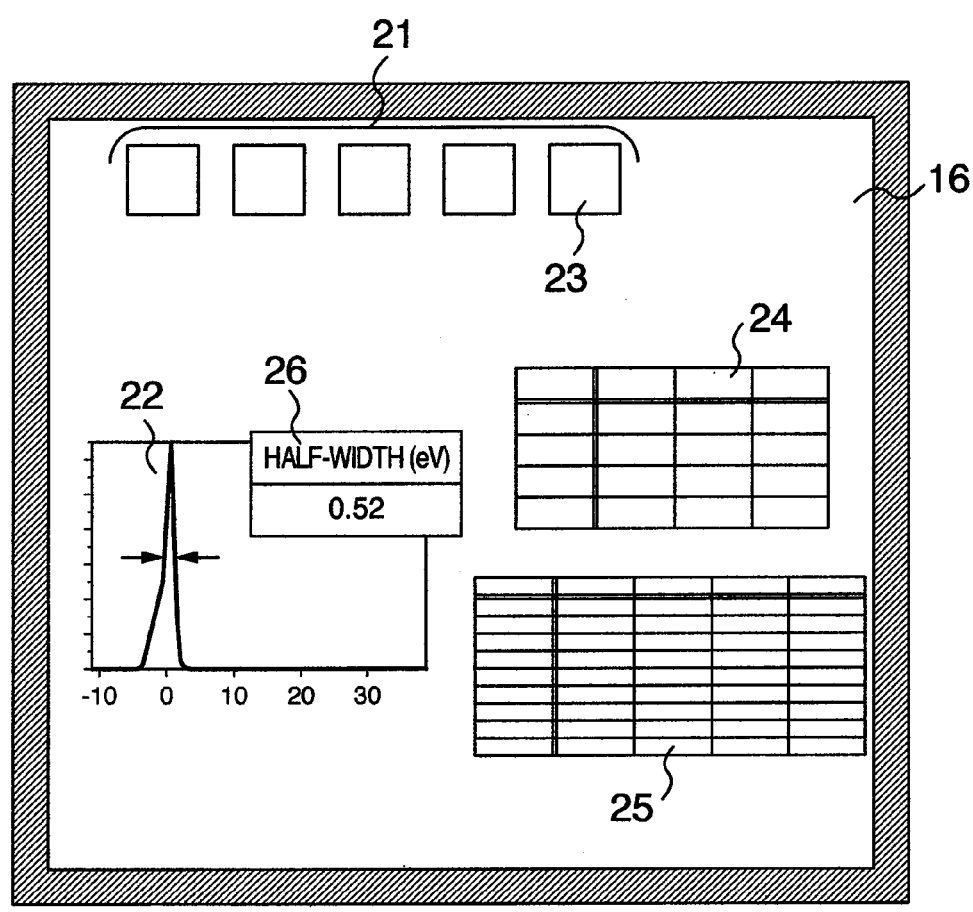
FIG. 3 is a diagram showing an example of the contents of display of an image display unit according to the invention.

Subsequently, operation the operator conducts and the operation command screen of the electron microscope will be described. Illustrated in FIG. 3 is an example of the contents of display on the image display unit 16. A selection button group 21 includes a spectrum acquisition start/end button, a spectrum acquisition time change button, a button for determination of a half-width of a zero-loss spectrum and a zero-loss spectrum peak half-width adjustment button 23. For example, when the spectrum acquisition start button of selection button group 21 is selected, an electron energy loss spectrum 22 acquired by the imaging unit 15 is displayed.

When the zero-loss spectrum peak half-width adjustment button 23 of selection button group 21 is selected, a multi-pole lens exciting current parameter input table 24 and an orthogonal array 25 are displayed. Exciting currents of multi-pole lenses are inputted as parameters to the exciting current parameter input table 24. As an input value, either a fixed value or a value to be set can be selected. After the parameters have been inputted to the exciting current parameter input table 24, allotment to the orthogonal array 25 based on the Taguchi method is carried out. In case the parameters are set automatically, the exciting current parameter input table 24 and orthogonal array 25 for the multi-pole lenses need not be displayed each time that the zero-loss spectrum peak half-width adjustment button 23 is selected. Further, as the orthogonal array, the L-9 or L-18 orthogonal array can be used in accordance with the number of lenses for which the adjustment is required.

Whether the factor effect table and the relational expression between the parameter of each lens and the half-width are to be displayed can be changed as desired.

The image display unit 16 additionally incorporates a function 26 of calculating and displaying a peak half-width of zero-loss spectrum. An example of procedures for calculation and display of zero-loss spectrum half-width will be described below. (1) A zero-loss spectrum is displayed. (2) A maximum peak intensity and a maximum peak position the zero-loss spectrum has are determined. (3) The maximum peak position of the zero-loss spectrum is set to 0 eV. (4) A half value of maximum peak intensity, that is, half the intensity of zero-cross spectrum is calculated. (5) In connection with loss energy value in the vicinity of the half-value of the maximum peak intensity, the loss energy values are calculated from a spectrum range on the left side of 0 eV and a spectrum range on the right side of 0 eV, respectively. (6) The loss energy value determined from the left-side spectrum range is subtracted from the loss energy value determined from the right-side spectrum range to determine a peak half-width of the zero-loss spectrum. (7) The peak half-width is displayed on the image display unit 16. The present procedures are exemplified as showing a calculation/display method of the peak half-width of the zero-loss spectrum but the calculation method is not limited thereto.

An input table of exciting current parameters of the multi-pole lenses will now be described with reference to FIG. 4. Described in the left-edge column are individual lens numbers (lens 1=multi-pole lens 11, lens 2=multi-pole lens 12, lens 3=multi-pole lens 13 and lens 4=multi-pole lens 14). The number of entries can be increased/decreased in accordance with the number of multi-pole lenses necessary for adjustment. Described in the uppermost line or row are parameter numbers (parameters 1 to 3) of exciting currents set to the individual lenses. Three parameters are set to each multi-pole lens. The parameter may be fixed during apparatus installation or may be set every adjustment before measurement as described previously.

An L-9 orthogonal array in the present invention will now be described with reference to FIG. 5. Described in the left-edge column are experiment condition numbers (experiment conditions 1 to 9) and described in the uppermost line or row are lens numbers required of adjustment (lens 1=multi-pole lens 11, lens 2=multi-pole lens 12, lens 3=multi-pole lens 13 and lens 4=multi-pole lens 14). Inputting of a parameter is discriminatively depicted by a decorative indication in FIG. 5 as in the case of FIG. 4. In the case of the number of multi-pole lenses required of adjustment being more than 4, an L-18 orthogonal array is used.

Next, the results obtained by practicing the above embodiment will be described. In this instance, for a transmission electron microscope with an electron spectrometer having four multi-pole lenses, these lenses inside the electron spectrometer are adjusted by using the present lens adjustment system to minimize the peak half-width of a zero-loss spectrum During acquisition of the zero-loss spectrum, the accelerating voltage in the transmission electron microscope is set to 197 kV, the electron beam takeout angle is set to 4.4 mrad and the energy dispersion is set to 0.05 eV/ch. An imaging unit 15 used for zero-loss spectrum acquisition is a 1024×1024 two-dimensional detector.

Figure 6:
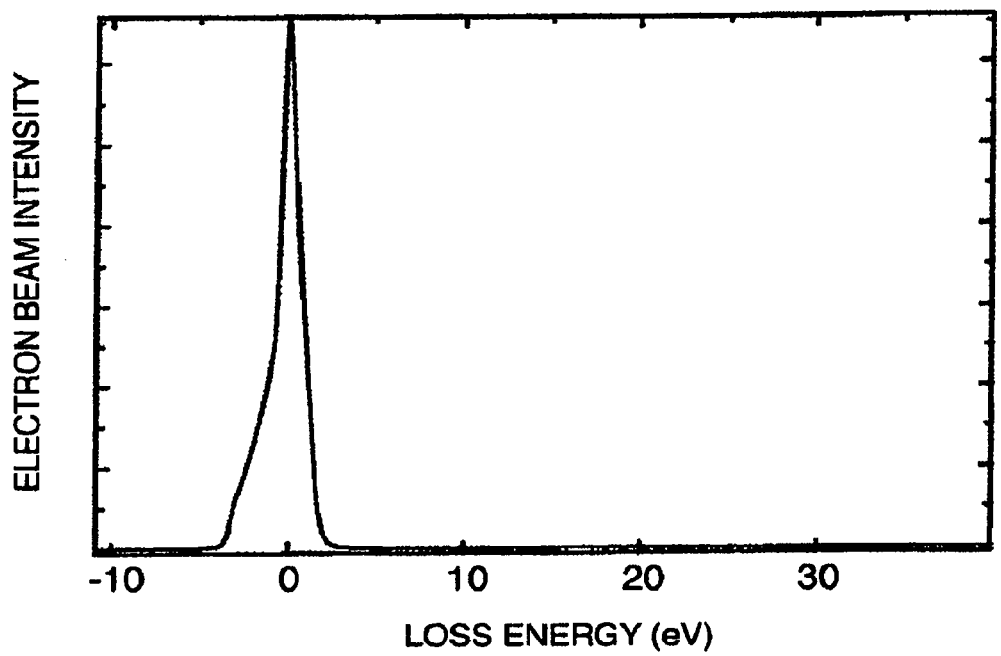
FIG. 6 is a graph depicting a zero-loss spectrum obtained before a lens adjustment system according to an embodiment of the invention is used.

A zero-loss spectrum before adjustment is illustrated in FIG. 6. The zero-loss spectrum has a peak half-width of 1.3 eV before adjustment of the lenses.

In this example, the four multi-pole lenses 11, 12, 13 and 14 inside the electron spectrometer are scheduled for adjustment and therefore the L-9 orthogonal array is used. The number of simulation operations is 2. Parameters for the individual multi-pole lenses to be inputted to the exciting current parameter input table 24 do not represent exciting currents per se passed to the individual multi-pole lenses but they represent ratios when the amounts of maximum and minimum exciting currents are set to +100 and −100, respectively.

Figure 7:
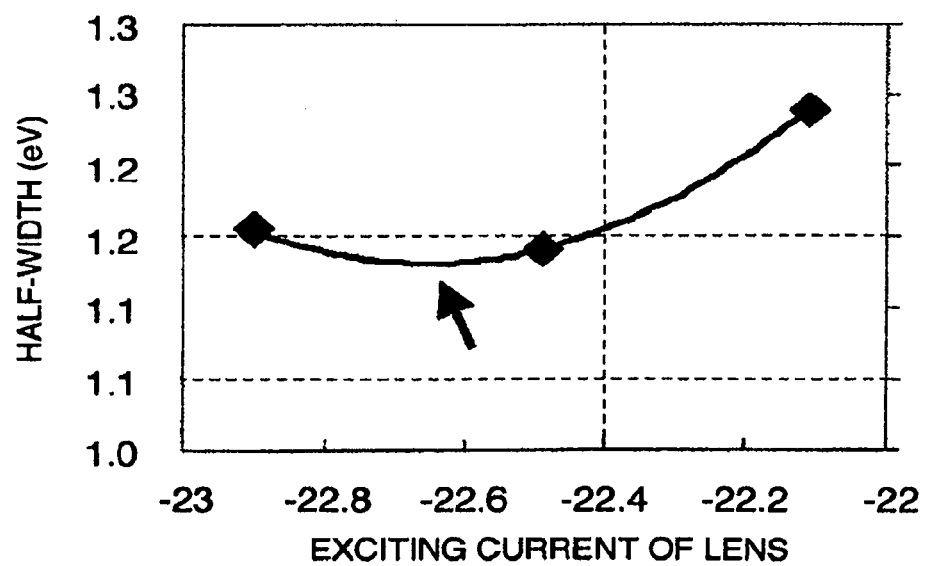
FIG. 7 is a graph showing the relation between the exciting current parameter of a lens 1 and the half-width according to an embodiment of the invention.
Figure 8:
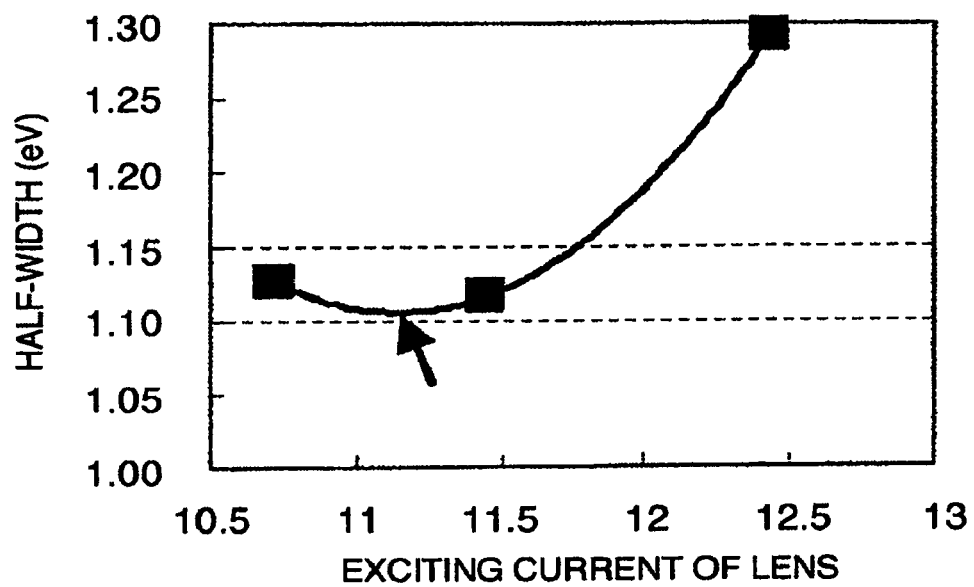
FIG. 8 is a graph showing the relation between the exciting current parameter of a lens 2 and the half-width according to an embodiment of the invention.
Figure 9:
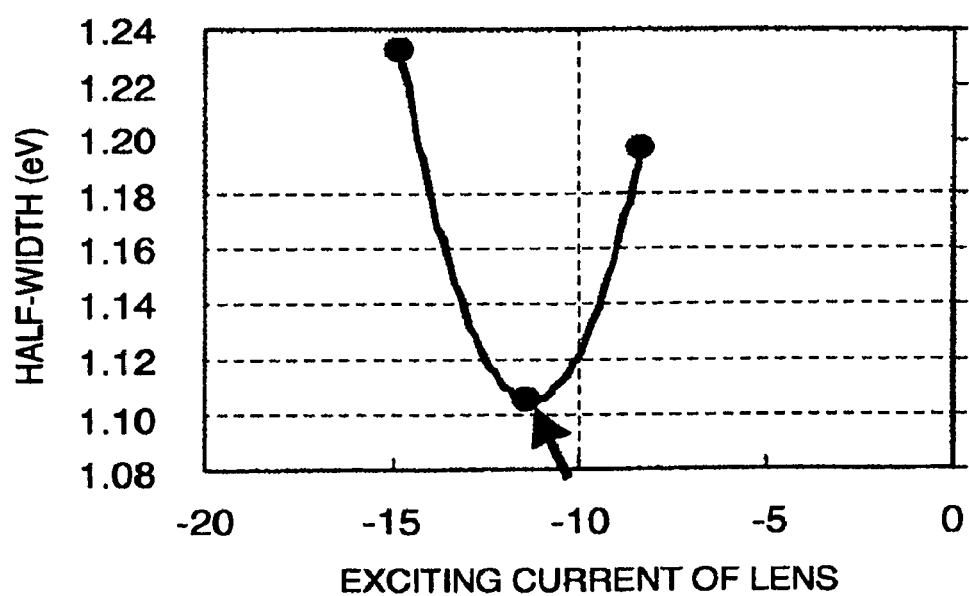
FIG. 9 is a graph showing the relation between the exciting current parameter of a lens 3 and the half-width according to an embodiment of the invention.

Examples of the factor effect diagram showing the relation between the input parameter (exciting current) of each of the multi-pole lenses 11, 12, 13 and 14 (lenses 1, 2, 3 and 4) and the half-width are illustrated graphically in FIGS. 7 to 9. In each relational diagram, a parameter making the peak half-width of a zero-loss spectrum minimum is determined in respect of each multi-pole lens by fitting a quadratic function. In the second simulation operation, ±10% of results obtained in the first simulation are used as parameters and are again allotted to the L-9 orthogonal array. In this instance, the relation between the input parameter and the half-width is fit by a quadratic function but this relational expression is not limitative.

Figure 10:
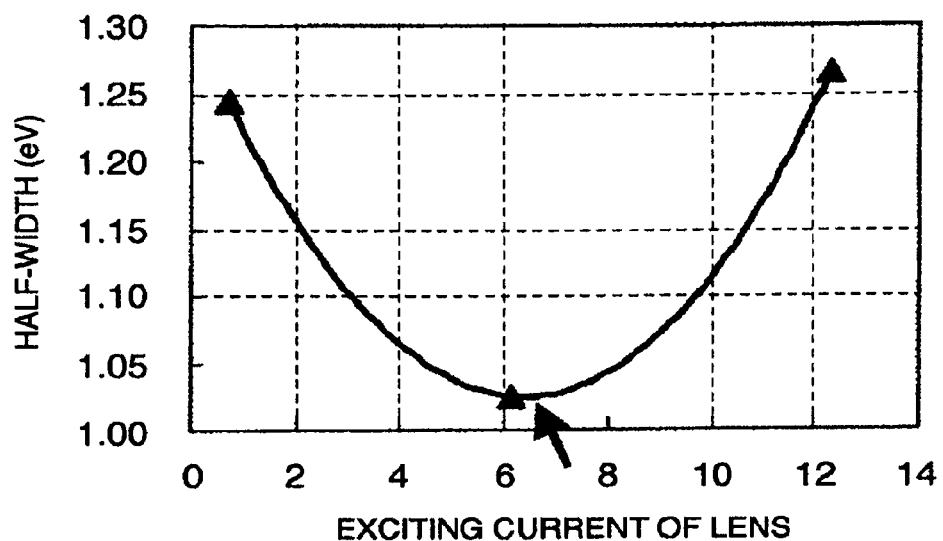
FIG. 10 is a graph showing the relation between the exciting current parameter of a lens 4 and the half-width according to an embodiment of the invention.
Figure 11:
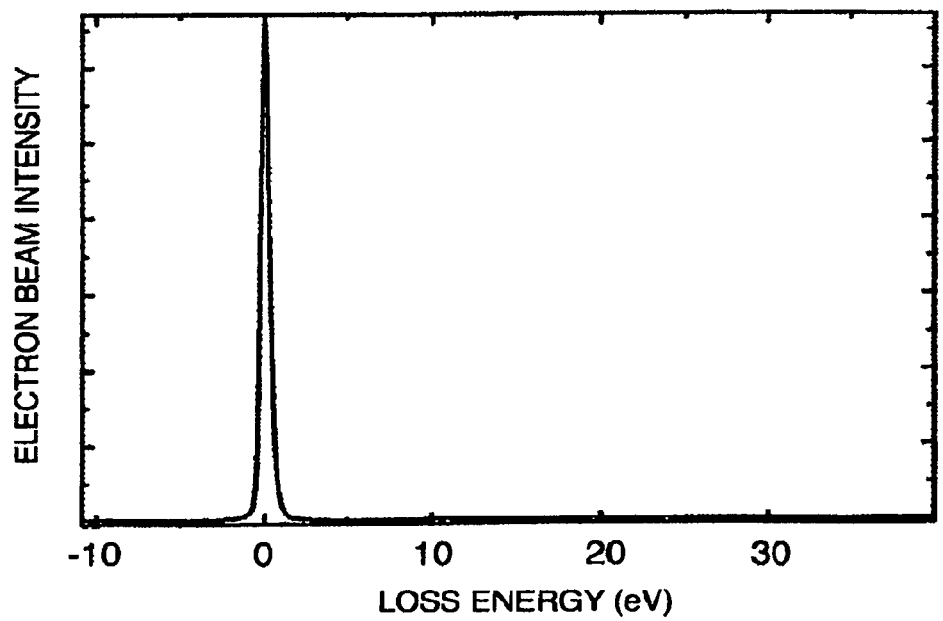
FIG. 11 is a graph depicting a zero-loss spectrum obtained by using the lens adjustment system according to the present invention.

Parameters for the individual multi-pole lenses outputted after the second simulation are determined as being −22.65 (FIG. 7), 11.15 (FIG. 8), −11.28 (FIG. 9) and 6.38 (FIG. 10), respectively. The individual lenses are adjusted on the basis of the results to obtain a zero-loss spectrum as shown in FIG. 11. After adjustment, the zero-loss spectrum has a peak half-width of 0.6 eV. For confirmation, peak half-widths of the zero-loss spectrum are determined manually over the whole variation area (±100) of each multi-pole lens to obtain similar results, proving that the individual multi-pole lenses inside the electron spectrometer 8 are adjusted to the optimum conditions. Conventionally, for the individual multi-pole lenses, the adjustment is carried out using the range of all variation areas of exciting current amounts but according to the invention, the adjustment within a limited range is conducted and the time of adjustment can be shortened.

If, after the use of the present adjustment system, only values intimately nearby the outputted parameters are confirmed, the individual multi-pole lenses can be adjusted with far higher accuracies.

The above example has been described by way of example of the provision of the condition adjustment button for the lens adjustment system operation on the spectrum confirmation screen but this button may be provided at a different location such as the electron spectrometer, electron microscope or controller. Especially when the parameter is not changed during the lens adjustment each time that measurement is conducted and a predetermined value thereof is used, the parameter need not be inputted every measurement and therefore it matters little to inconvenience whether the start button is not provided on the image display unit.

As will be seen from the above, with the lens adjustment method and system according to the foregoing embodiments, the electron spectrometer attached to the electron microscope and being capable of acquiring the electron energy loss spectrum and two-dimensional element distribution image can be adjusted highly efficiently and highly accurately. According to the foregoing embodiments, the factor effect table is prepared by using the half-width of the spectrum and then the lenses are adjusted but alternatively, the lens adjustment may be conducted by using a different kind of parameter such as a peak intensity of the spectrum.

In the present embodiment, only the method of adjusting the zero-loss spectrum before acquisition of the electron energy loss spectrum has been described but the invention may also be applied to image focus adjustment when acquiring the two-dimensional element distribution.

Even in a different type of apparatus having a plurality of lenses, the minimum beam diameter can be adjusted as in the case of the electron spectrometer, in the course of adjustment of focus/defocus and correction of spherical/chromatic aberration, nano-diffraction/analysis, focused electron diffraction or acquisition of an electron beam holography. Accordingly, the aforementioned lens adjustment system can be used easily for the apparatus having the plural lenses to perform adjustment of these lenses.

Further, by using the value such as the spectrum half-width in the foregoing embodiments which is outputted from an image/spectrum obtained with the detector and is used for preparation of the factor effect table, the lenses can be adjusted. For example, in order to adjust the lenses with a view to adjusting the focus and astigmatism in an electron microscope image, the degree of true circle or distortion at the central portion after Fourier transform of the electron microscope image obtained from an amorphous portion or either the beam diameter or beam shape can be used.

The lens adjustment system may advantageously be applied to other apparatus than that described as above and improvements in accuracy and operation easiness as well of adjustment of the lenses can be achieved to advantage.

The present invention made by the present inventors has been described specifically by way of example of the embodiments but the invention is in no way limited to the embodiments and can be changed or modified within a range without departing from the gist of the present invention.

The invention claimed is:

1. An electron energy loss spectral observation apparatus comprising:
    a transmission or scanning transmission electron microscope;
    an electron spectrometer having a plurality of lenses; and
    an electron spectrometer controller for controlling the electron spectrometer,
    wherein the electron spectrometer controller includes:
        simulation means based on a parameter design method using, as parameters, exciting current values of the individual lenses or values set on the basis of the exciting current values, for simulating fluctuation of electron energy loss spectral data when a plurality of parameters of the individual lenses are fluctuated simultaneously and conditions of the individual lenses are decided by calculation values based on the simulation result.

2. The electron energy loss spectral observation apparatus according to claim 1, wherein the simulation means is configured to implement functions, including functions to:
    allot the parameters to a orthogonal array;
    acquire electron energy loss spectral data in accordance with individual conditions based on the orthogonal array;
    prepare a factor effect table on the basis of electron energy loss spectral data corresponding to the individual conditions; and
    calculate optimum parameters from the factor effect table.

3. An electron microscope comprising:
    an electron spectrometer having a plurality of lenses and adapted to perform energy spectroscopy; and
    a lens adjustment system for adjusting the lenses,
    wherein the lens adjustment system controls conditions of the individual lenses based on a simulation of fluctuation of electron energy loss spectral data when a plurality of exciting currents or values set on the basis of the exciting currents are fluctuated simultaneously.

4. The electron microscope according to claim 3,
    wherein the lens adjustment system sets conditions of the individual lenses through simulation based on a parameter design method using, as parameters, exciting currents or values set on the basis of the exciting currents.

5. The electron microscope according to claim 4, wherein the lens adjustment system is configured to perform implement functions, including functions to:
    read input values of the parameters;
    allot the parameters to an orthogonal array;
    acquire spectral data corresponding to conditions based on the orthogonal array;
    prepare a factor effect table from the acquired spectral data;
    calculate conditions of exciting currents of the individual lenses from the factor effect table: and
    control the exciting currents of the individual lenses on the basis of the calculated exciting current values of the individual lenses.

6. The electron microscope according to claim 4, further comprising:
    an image display unit for displaying spectral data of the electron microscope, wherein:
    the image display unit displays a lens adjustment button for starting adjustment of lens conditions on the image display screen, and
    the lens adjustment system is started in accordance with a command via the lens adjustment button.

7. The electron microscope according to claim 4, wherein:
    at least any one of the parameters is a fixed value set during production of the apparatus or installation thereof,
    at least any one of the other parameters is a variable value to be set during adjustment, and
    the lens adjustment system adjusts a lens corresponding to the variable value.

8. A lens adjustment method including simulation means configured to implement functions, including functions to:
    adjust optimum conditions of a plurality of lenses, wherein exciting currents of the individual lenses or values set on the basis of the exciting currents are used as parameters; and
    carry out simulation based on a parameter design method, wherein:

conditions of exciting currents of the individual lenses are set on the basis of calculation values based on the simulation.

9. A lens adjustment method comprising steps of:
adjusting optimum conditions of a plurality of lenses of an electron spectrometer attached to an electron microscope and adapted to perform energy spectroscopy, wherein exciting currents of the individual lenses or values set on the basis of the exciting currents are used as parameters; and
carrying out simulation based on a parameter design method, wherein
conditions of exciting currents of the individual lenses are set on the basis of calculation values based on simulation of fluctuation of electron energy loss spectral data for fluctuation of parameters of the individual lenses.

10. The lens adjustment method according to claim 9, wherein the step of carrying out simulation comprises:
reading parameters of each lens,
allotting the parameters to an orthogonal array,
acquiring spectral data in accordance with conditions based on the orthogonal array,
preparing a factor effect table from the acquired data, and
calculating conditions of exciting currents of the individual lenses on the basis of the factor effect table.

11. A lens adjustment system for adjusting conditions of a plurality of lenses of an electron spectrometer, the system comprising:
simulation means based on a parameter design method using, as parameters, exciting current values of the individual plural lenses or values set on the basis of the exciting current values, wherein:
of a group of the lenses, the simulation means sets a lens with fixed parameters and sets another lens is set with unfixed parameters, and during lens condition adjustment, and
conditions of the lens for which the parameters are unfixed are adjusted on the basis of calculation values based on simulation of fluctuation of electron energy loss spectral data for fluctuation of parameters of the individual lenses by the simulation means.

12. A lens adjustment method comprising steps of:
adjusting exciting current values of individual lenses of an electron spectrometer by setting at least three parameters based on exciting current values for each lens and a number of simulation operations; and
conducting simulation on the basis of the set values, wherein the simulation includes:
inserting three parameters based on the exciting current values, as parameters of the individual lenses, to an orthogonal array;
measuring a zero-loss spectrum under the individual conditions based on the orthogonal array;
calculating a half-width of the measured zero-loss spectrum;
preparing a factor effect table from the half-width corresponding to each calculated condition;
acquiring a relational expression between the exciting current value of each lens and the half-width from the factor effect table; and
calculating the exciting current value of each lens from the relational expression,
wherein the simulation is repeated in accordance with a frequency of the simulation by using the calculated exciting current value as an initial value.

13. A controlling apparatus for an electron spectrometer comprising a plurality of lenses, wherein:
the apparatus is configured to adjust exciting current values of individual lenses of the electron spectrometer including a plurality of lenses, the exciting current values of individual lenses of the electron spectrometer being adjusted by the apparatus through simulation based on at least three parameters based on exciting current values for each lens and the number of simulation operations, wherein the simulation includes the functions to:
insert three parameters based on the exciting current values, as parameters of the individual lenses, to an orthogonal array;
measure a zero-loss spectrum under the individual conditions based on the orthogonal array;
calculate a half-width of the measured zero-loss spectrum;
prepare a factor effect table from the half-width corresponding to each calculated condition;
acquire a relational expression between the exciting current value of each lens and the half-width from the factor effect table; and
calculate the exciting current value of each lens from the relational expression,
the controlling apparatus being further configures to set the exciting current value of each lens by repeating the simulation in accordance with a frequency of the simulation by using the calculated exciting current value as an initial value.

14. The controlling apparatus according to claim 13, further comprising:
a storing apparatus for storing at least one of the initial value and the calculated exciting current value by the simulation.

15. An electron microscope comprising the controlling apparatus according to claim 14.

16. An electron energy loss spectral observation apparatus comprising the controlling apparatus according to claim 14.

17. An electron microscope comprising the controlling apparatus according to claim 13.

18. An electron energy loss spectral observation apparatus comprising the controlling apparatus according to claim 13.

* * * * *